US006879274B2

(12) United States Patent
Nestler et al.

(10) Patent No.: US 6,879,274 B2
(45) Date of Patent: Apr. 12, 2005

(54) SIGNAL-CONDITIONING AND ANALOG-TO-DIGITAL CONVERSION CIRCUIT ARCHITECTURE

(75) Inventors: Eric Nestler, Harvard, MA (US); Paul Daigle, Haverhill, MA (US); Michael A. Ashburn, Jr., Groton, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/785,831

(22) Filed: Feb. 24, 2004

(65) Prior Publication Data

US 2004/0252043 A1 Dec. 16, 2004

Related U.S. Application Data

(60) Provisional application No. 60/449,743, filed on Feb. 24, 2003.

(51) Int. Cl.[7] .................................................. H03M 1/06
(52) U.S. Cl. ........................ 341/118; 341/111; 341/120; 341/155
(58) Field of Search ................................. 341/118, 111, 341/120, 155

(56) References Cited

U.S. PATENT DOCUMENTS

| 5,101,160 | A | 3/1992 | Barjonnet et al. |
| 5,563,597 | A | 10/1996 | McCartney |
| 5,652,512 | A | 7/1997 | Feintuch et al. |
| 5,760,617 | A | 6/1998 | Coln et al. |
| 5,861,754 | A | 1/1999 | Ueno et al. |
| 5,862,069 | A | 1/1999 | Nestler |
| 5,872,469 | A | 2/1999 | Nestler |
| 6,029,363 | A | 2/2000 | Masreliez et al. |

(Continued)

OTHER PUBLICATIONS

"Differential Sensor Signal Conditioner," ZMD Sensor ICs. Datasheet. Rev. 1.4, Mar. 27, 2002. p. 1–4.
"A multichannel Digital Demodulator for LVDT/RVDT Position Sensors," Yassa et al. IEEE Journal of Solid–State Circuits. Apr. 1990.
"Description of a digital AC Ratiometric Sensor Conditioner," Lehman et al. IEEE Instrumentation and Measurement Technology Conference. 1995. Waltham, MA.
"A Novel DSP–Based lvdt Signal Conditioner," Ford et al. IEEE Transactions on Instrumentation and Measurement. Jun. 2001. vol. 50, No. 3.
"Application of an FFT–Based Aklgorithm to Signal Processing of LVDT Position Sensore," Crescini et al. IEEE Transactions on Instrumentation and Measurement. Oct. 1998. vol. 47, No. 5.

Primary Examiner—Michael Tokar
Assistant Examiner—Lam T. Mai
(74) Attorney, Agent, or Firm—Gauthier & Connors LLP

(57) ABSTRACT

An analog-to-digital metering circuit includes a first programmable gain amplifier to amplify a first voltage signal from a first channel before being received by a first analog-to-digital converter that converts the amplified first voltage signal to a first digital signal. A second programmable gain amplifier amplifies a second voltage signal from a second channel and feds the amplified signal to a second analog-to-digital converter that converts the amplified second voltage signal to a second digital signal. A first lowpass filter circuit receives the first and second digital signals, to generate therefrom, a multi-bit analog-to-digital value. A direct digital synthesizer generates a digital signal representing a predetermined waveform that is fed to a digital-to-analog converter. The second voltage signal and the digital signal representing the predetermined waveform are multiplied together to generate a digital value. Phase shifting circuitry provides a signal representing a 90-degree phase shift of the digital value and a signal representing a 0-degree phase shift of the digital value. RMS circuitry converts the 0-degree phase digital signal into an In-Phase signal and the 90-degree phase digital signal into a Quadrature signal.

73 Claims, 11 Drawing Sheets

U.S. PATENT DOCUMENTS

| | | | |
|---|---|---|---|
| 6,281,829 B1 * | 8/2001 | Amrany et al. | 341/155 |
| 6,307,493 B1 | 10/2001 | Nestler | |
| 6,369,740 B1 * | 4/2002 | Swanson | 341/118 |
| 6,441,766 B1 * | 8/2002 | Chuang et al. | 341/155 |
| 6,480,137 B2 * | 11/2002 | Kulkarni et al. | 341/120 |
| 6,509,852 B1 * | 1/2003 | Todsen et al. | 341/118 |
| 6,593,865 B2 | 7/2003 | Nestler et al. | |
| 6,756,924 B2 * | 6/2004 | Lee et al. | 341/118 |

* cited by examiner

SIGNAL-CONDITIONING AND ANALOG-TO-DIGITAL CONVERSION CIRCUIT ARCHITECTURE

PRIORITY INFORMATION

This application claims priority under 35 U.S.C. §119(e) from U.S. Provisional Patent Application, Ser. No. 60/449,743, filed on Feb. 24, 2003. The entire content of U.S. Provisional Patent Application, Ser. No. 60/499,743, is hereby incorporated by reference.

FIELD OF THE PRESENT INVENTION

The present invention relates to circuit architecture for providing analog-to-digital conversion and, in particular, to provide an analog to conversion circuit architecture with signal conditioning features to provide a more accurate metering of analog sensors connected to an analog-to-digital converter.

BACKGROUND OF THE PRESENT INVENTION

Analog-to-digital converters have been used in a variety of applications and fields of technology, such as sensor applications, to provide an effective way of converting analog signals into digital signals. The effectiveness of the analog signal to digital signal conversion is critical in gathering accurate readings from the sensor. Moreover, many sensor applications require the outputs to be differential so as to reject common mode noise sources.

In these applications, not only is an analog-to-digital converter needed, but a specific signal is needed to drive the sensor. The sensor then generates the analog input signal for analog-to-digital conversion. The providing of the specific signal is generally referred to as a signal conditioner for the transducers.

To realize this requirement, conventional systems have often used a bridge configuration to get a zero output with no stimulus to the sensor.

An example of a conventional bridge configuration sensor system is illustrated in FIG. 1. As illustrated in FIG. 1, a second order modulator 20 is connected to two nodes of a bridge circuit 10. Moreover, a digital-to-analog converter 30 is connected to the two remaining nodes of the bridge circuit 10.

The bridge elements can be resistive, capacitive, or inductive, depending on the type of sensor. The drive signal from the digital-to-analog converter 30 should be differential, so the output common mode is constant. Making one side of the drive zero volts with a bipolar [−V to +V] drive range for the other side makes the common mode voltage constant. However, this environment is difficult to realize when using a single supply part.

Although conventional systems have used bridge configurations with some form of signal conditioning, these conventional systems have not provided the high accuracy needed in many applications. For example, in energy metering applications, high accuracy is a key requirement. To meet this need, conventional energy metering systems include a microprocessor unit to provide the signal conditioning. However, since high accuracy results require considerable signal processing on a continuous basis, the signal processing requirements are not easily coded as software loops, thereby resulting in degraded accuracy or high costs of implementation.

Therefore, it is desirable to provide a sensor system that includes high performance continuous basis signal conditioning. Moreover, it is desirable to provide a sensor system capable of converting analog waveforms to digital samples for digital processing to recover the required information, and at the same time provide a digital-to-analog converter to provide signal-conditioning so that the digital signal processing of the sensor system can synchronize the processing of both signals. The synchronization of both signals also enables other functions to be implemented efficiently, such as calibration and noise reduction, without requiring significant efforts of coding.

SUMMARY OF THE PRESENT INVENTION

A first aspect of the present invention is an analog-to-digital metering device. The analog-to-digital metering device includes a first programmable gain amplifier to amplify a first voltage signal from a first channel; a second programmable gain amplifier to amplify a second voltage signal from a second channel; a first analog-to-digital converter to convert the amplified first voltage signal to a first digital signal; a second analog-to-digital converter to convert the amplified second voltage signal to a second digital signal; a first lowpass filter circuit, receiving the first and second digital signals, to generate, therefrom, a filtered digital signal; a direct digital synthesizer to generate a digital signal representing a predetermined waveform; a first multiplier to multiply the second voltage signal and the digital signal representing the predetermined waveform to generate a digital-to-analog value; a phase shifter circuit, operatively connected to the first multiplier, to generate a signal representing a 90 degree phase shift of the digital-to-analog value; a second multiplier, operatively connected to the phase shifter circuit and the first analog-to-digital converter, to multiply the signals therefrom and to produce a 90 degree phase signal; a third multiplier, operatively connected to the first multiplier and the first analog-to-digital converter, to multiply the signals therefrom and to produce a zero degree phase signal; a second lowpass filter circuit, operatively connected to the second and third multipliers, to filter the 90 degree and zero degree phase signals; a first root-mean-square circuit to convert the filtered zero degree phase digital signal into an In-Phase signal; and a second root-mean-square circuit to convert the filtered 90 degree phase digital signal into a Quadrature signal.

A second aspect of the present invention is an analog-to-digital metering device. The analog-to-digital metering device includes a multiplexer to multiplex between two channels having analog signals thereon; a programmable gain amplifier to amplify the voltage signal from multiplexer; an analog-to-digital converter to convert the amplified voltage signal to a digital signal; a first lowpass filter circuit, receiving said digital signal, to generate, therefrom, a filtered digital signal; a direct digital synthesizer to generate a digital signal representing a predetermined waveform; a phase shifter circuit, operatively connected to said direct digital synthesizer, to generate a signal representing a 90 degree phase shift of said predetermined waveform; a first multiplier, operatively connected to said phase shifter circuit and said analog-to-digital converter, to multiply the signals therefrom and to produce a 90 degree phase signal; a second multiplier, operatively connected to said direct digital synthesizer and said analog-to-digital converter, to multiply the signals therefrom and to produce a zero degree phase signal; a second lowpass filter circuit, operatively connected to said first and second multipliers, to filter said 90 degree and zero degree phase signals; a first root-mean-square circuit to convert the filtered zero degree phase digital signal into an In-Phase signal; and a second rootmean-square circuit to convert the filtered 90 degree phase digital signal into a Quadrature signal.

A third aspect of the present invention is an integrated circuit. The integrated circuit includes a first analog-to-digital converter to convert a first analog signal to a first digital signal; a signal generator to generate an analog excitation signal; a second analog-to-digital converter to convert the analog excitation signal to a second digital signal; and a multiplier, operatively connected to the first and second analog-to-digital converters, to multiply the signals therefrom.

A fourth aspect of the present invention is an integrated circuit. The integrated circuit includes an analog-to-digital converter to convert an analog signal to a first digital signal; a digital signal source to provide a second digital signal representing an excitation signal; a digital-to-analog converter, operatively connected to the digital signal source, to convert the second digital signal to an analog excitation signal; and a multiplier, operatively connected to the analog-to-digital converter and the digital signal source, to multiply the first and second digital signals.

A fifth aspect of the present invention is a method for excitation and synchronous demodulation. The method converts a first analog signal to a first digital signal; generates an analog excitation signal; converts the analog excitation signal to a second digital signal; and multiplies the first and second digital signals.

A sixth aspect of the present invention is a method for excitation and synchronous demodulation. The method converts an analog signal to a first digital signal; provides a second digital signal representing an excitation signal; converts the second digital signal to an analog excitation signal; and multiplies the first and second digital signals.

BRIEF DESCRIPTION OF THE DRAWINGS

The present invention may take form in various components and arrangements of components, and in various steps and arrangements of steps. The drawings are only for purposes of illustrating a preferred embodiment and are not to be construed as limiting the present invention, wherein.

DETAIL DESCRIPTION OF THE PRESENT INVENTION

Figure 1:
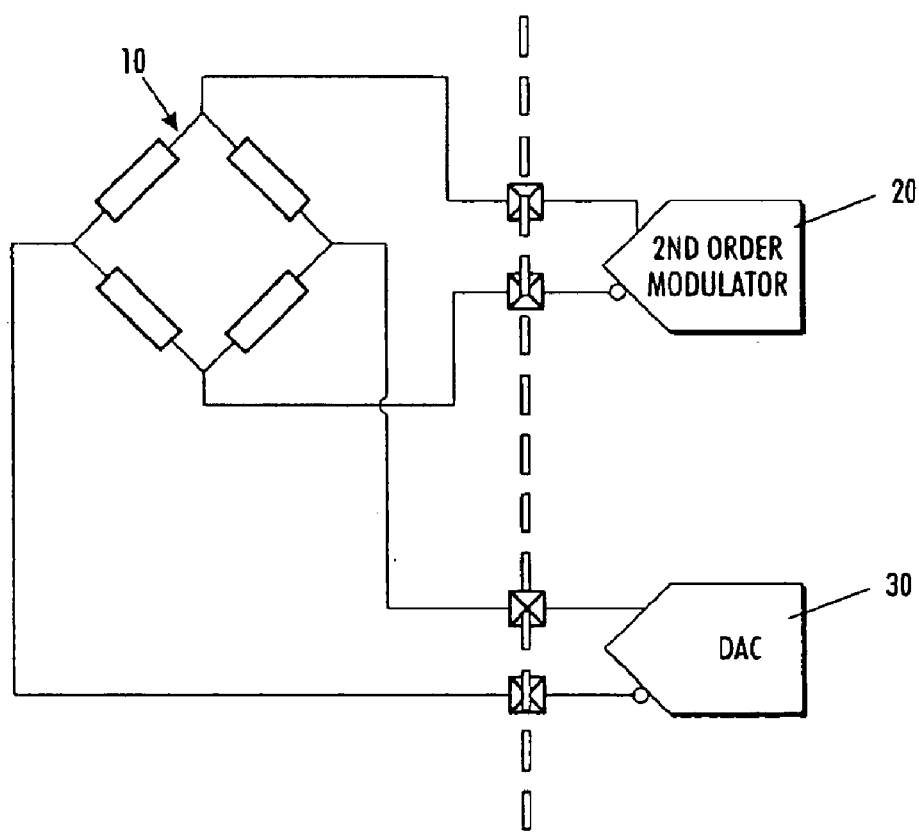
FIG. 1 is a schematic circuit diagram of a prior art bridge configuration.

The present invention will be described in connection with preferred embodiments; however, it will be understood that there is no intent to limit the present invention to the embodiments described herein. On the contrary, the intent is to cover all alternatives, modifications, and equivalents as may be included within the spirit and scope of the present invention, as defined by the appended claims.

For a general understanding of the present invention, reference is made to the drawings. In the drawings, like reference have been used throughout to designate identical or equivalent elements. It is also noted that the various drawings illustrating the present invention are not drawn to scale and that certain regions have been purposely drawn disproportionately so that the features and concepts of the present invention could be properly illustrated.

The present invention includes a digital-to-analog converter output for generating an electrical waveform to drive a sensor and an analog-to-digital converter to receive the analog output from the sensor. The received analog waveform is converted to digital samples and digitally processed to recover the required information. Since the present invention includes both the analog-to-digital converter and the digital-to-analog converter, the digital signal processing can synchronize the processing of both signals, thereby enabling other functions to be implemented efficiently, such as calibration and noise reduction.

Figure 2:
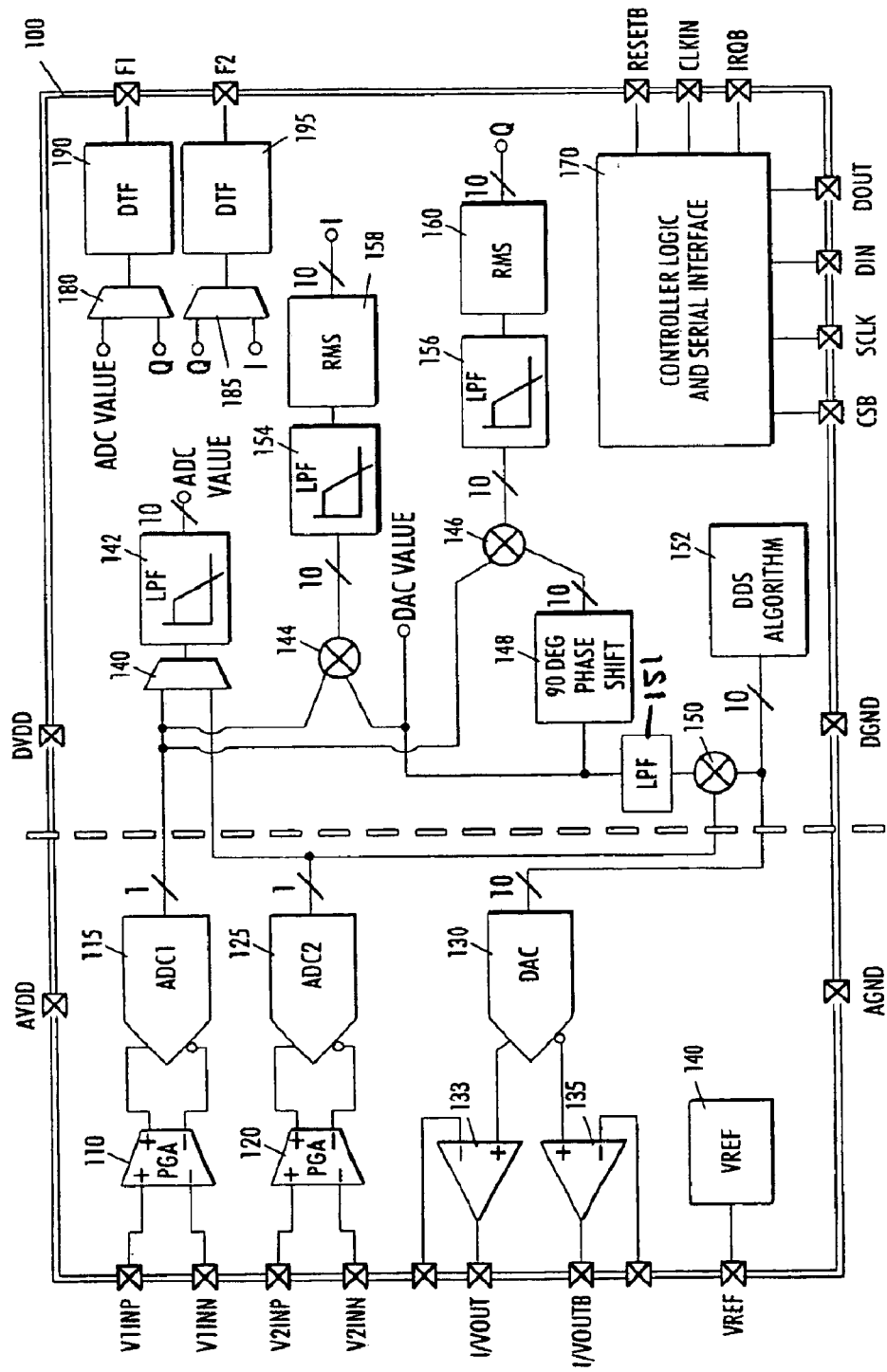
FIG. 2 is a schematic diagram of one embodiment of a signal-conditioning analog-to-digital conversion circuit in accordance with the concepts of present invention.

An exemplary embodiment of the concepts of the present invention is illustrated in FIG. 2. As illustrated in FIG. 2, an analog-to-digital signal-conditioning device 100 receives analog signals from a sensor (not shown). The analog signals are initially received by a set of programmable gain amplifier 110 and 120 before being processed by analog-to-digital converters (ADC1 and ADC2) 115 and 125.

The analog-to-digital converters 115 and 125 perform a similar function to the second order sigma delta modulator of FIG. 1 with single bit feedback. FIG. 2 shows two separate converters, but the implementation could utilize a multiplexing architecture to reduce the area and power. It is noted that the analog-to-digital converters 115 and 125 may also be multi-bit feedback. By having multi-bit feedback, the size of the multipliers can be prevented from getting too big.

In a preferred embodiment of the present invention, as utilized in an energy metering product, an input sampling structure is used that allows "below the bottom" input voltage range. In this embodiment, the input voltage range of this structure would be −1.0V to 1.0V.

It is noted that a simple modification could raise the input common mode voltage to a voltage between 0.0V and roughly $V_{DD}/2$.

In a metering product application, the single bit feedback is important because this application requires a very large linear dynamic range.

Alternatively, the analog-to-digital converter of the present invention could be implemented as a fast SAR type Nyquist converter. This embodiment would provide flatter RFI noise levels that are useful for applications needing a high sensor drive carrier frequency.

In one embodiment of the present invention the programmable gain stages 110 and 120 use a switch capacitor programmable gain capacitor array implementation. However, the programmable gain stages 110 and 120 may be continuous time INAMPs for gain changing.

An example of a preferred programmable gain stage is described in U.S. Pat. No. 5,872,469. The entire content of U.S. Pat. No. 5,872,469 is hereby incorporated by reference.

As further illustrated in FIG. 2, the analog-to-digital signal-conditioning device 100 includes a digital-to-analog converter 130. In one embodiment of the present invention, the digital-to-analog converter 130 is the AD9831™ available from Analog Devices.

The digital-to-analog converter 130 of the present invention is capable of very fast settling. Moreover, the digital-to-analog converter 130 would have an output that is fully differential with a common mode voltage around VDD/2. Connected to the digital-to-analog converter 130 are output buffers 133 and 135 that have negative feedback input as an output pin to allow some signal-conditioning of the digital-to-analog converter waveform voltage.

It is noted that the digital-to-analog converter 130 can also be modified to output current depending upon the specifications of the sensor. In a preferred embodiment, the digital-to-analog converter's resolution is 10 to 14 bits.

It is further noted that the digital-to-analog converter 130 may be a switch-capacitor digital-to-analog converter such as described in U.S. Pat. No. 5,563,597. The entire content of U.S. Pat. No. 5,563,597 is hereby incorporated by reference.

The analog-to-digital signal-conditioning device 100 also includes a voltage reference 140. Connected to the input of the digital-to-analog converter 130 is a Direct Digital Synthesis ("DDS") algorithm circuit 152. —A multiplier 150 multiplies an output signal from analog-to-digital converter (ADC2) 125 with a signal from the DDS algorithm circuit 152.

An example of a preferred multiplier is described in U.S. Pat. No. 5,862,069. The entire content of U.S. Pat. No. 5,862,069 is hereby incorporated by reference.

The DDS algorithm circuit 152 generates sine waves from 100 kHz to 20 Hz with distortion below the digital-to-analog converter's least significant bit quantization noise. The frequency may be selectable with a 16-bit register value. It is noted that the 100 kHz to 20 Hz is a preferred range, but the concepts of the present invention are clearly applicable to higher or lower frequency applications.

It is noted that several DDS phase integrators can be used to generate multiple waveforms, which could be simply summed before going to the digital-to-analog converter 130. This would allow more complicated system functions.

The output from the multiplier 150 is fed through a lowpass filter 151 before being fed to a 90-degree phase shifter circuit 148 and the input of another multiplier 144.

In a preferred embodiment, since the sine wave is synchronous with the DDS algorithm circuit's output waveform, it is possible to compute the 90-degree shifted waveform inside the DDS algorithm circuit 152 at the same time as the 0-degree phase waveform using a digital initial offset value of the phase accumulator.

Multiplier 144 receives an input from analog-to-digital converter (ADC1) 115 and multiplies the signal with the signal from multiplier 150, the product of which is fed to lowpass filter 154. Moreover, multiplier 146 receives an input from analog-to-digital converter (ADC1) 115 and multiplies the signal with the signal from 90-degree phase shifter circuit 148, the product of which is fed to lowpass filter 156.

In one embodiment of the present invention, the lowpass filters 154 and 156 may be third order SINC filters. In some applications these filters may not be needed at all.

The lowpass filters 154 and 156 are each connected to a RMS circuit 158 and 160, respectively. An example of a preferred RMS circuit is described in U.S. Pat. No. 6,307,493. The entire content of U.S. Pat. No. 6,307,493 is hereby incorporated by reference.

The RMS circuit 158 produces an In-Phase signal, and RMS circuit 160 produces a Quadrature signal.

The In-Phase signal and Quadrature signal are fed to a digital to frequency circuit including comparators 180 and 185 and digital to frequency converters 190 and 195. An example of a digital to frequency converter circuit is described in U.S. Pat. No. 5,760,617. The entire content of U.S. Pat. No. 5,760,617 is hereby incorporated by reference.

Alternatively, the output from the digital to frequency converters 190 and 195 may be pulse width modulate signals.

Figure 3:
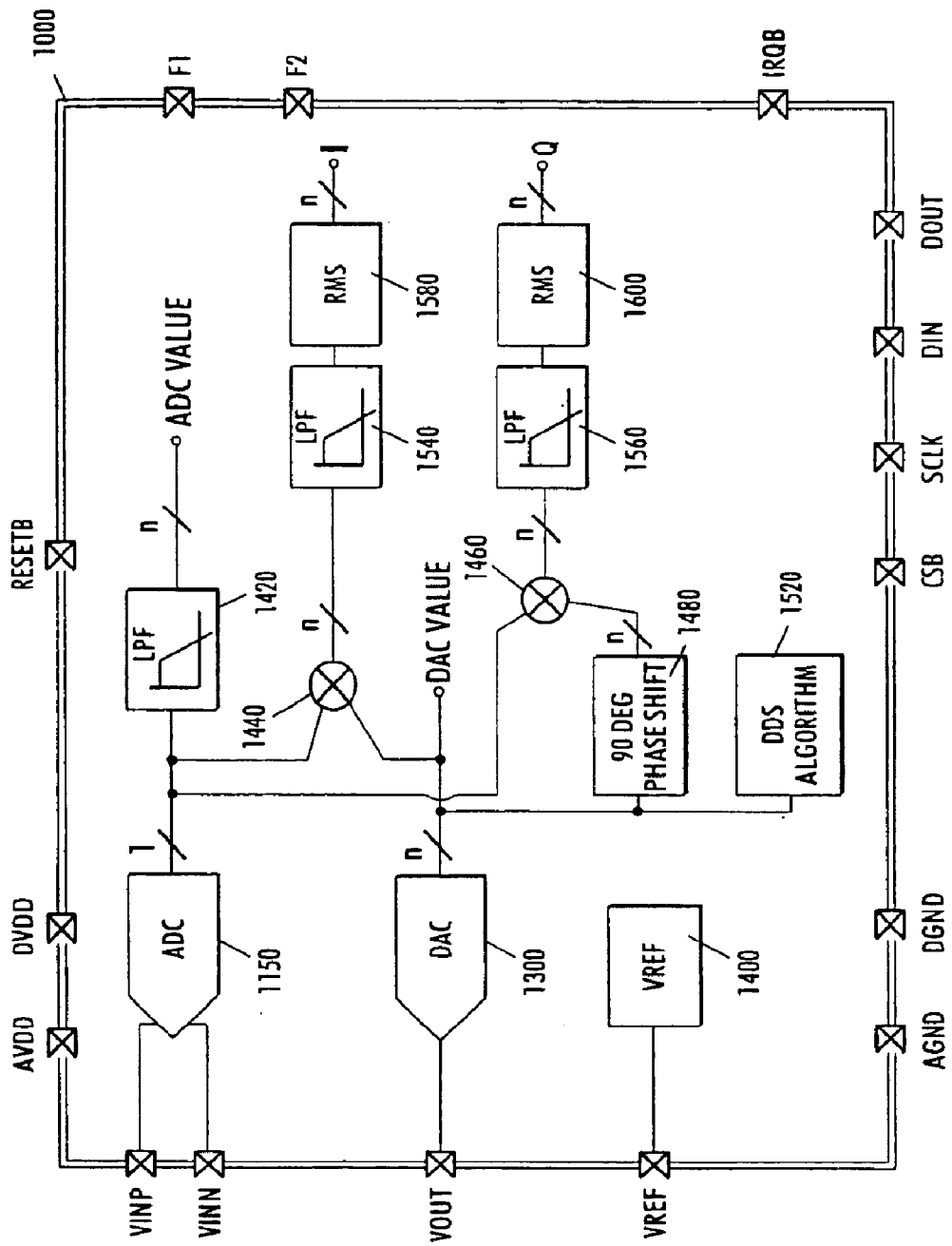
FIG. 3 is a schematic diagram of another embodiment of a signal-conditioning analog-to-digital conversion circuit in accordance with the concepts of present invention.

FIG. 3 illustrates another embodiment of the present invention. As illustrated in FIG. 3, an analog-to-digital signal-conditioning device 1000 receives analog signals from a sensor (not shown). The analog signals are initially received by an analog-to-digital converter 1150.

In a preferred embodiment of the present invention, as utilized in an energy metering product, an input sampling structure is used that allows "below the bottom" input voltage range. In this embodiment, the input voltage range of this structure would be −1.0V to 1.0V.

It is noted that a simple modification could raise the input common mode voltage to a voltage between 0.0V and roughly $V_{DD}/2$.

In a metering product application, the single bit feedback is important because this application requires a very large linear dynamic range.

Alternatively, the analog-to-digital converter of the present invention could be implemented as a fast SAR type Nyquist converter. This embodiment would provide flatter RFI noise levels that are useful for applications needing a high sensor drive carrier frequency.

As further illustrated in FIG. 3, the analog-to-digital signal-conditioning device 1000 includes a digital-to-analog converter 1300. In one embodiment of the present invention, the digital-to-analog converter 1300 is the AD9831™ available from Analog Devices. This embodiment may also include the buffers of FIG. 2 to enhance signal conditioning.

The digital-to-analog converter 1300 of the present invention is capable of very fast settling. Moreover, the digital-to-analog converter 1300 would have an output that is fully differential with a common mode voltage around VDD/2.

It is noted that the digital-to-analog converter 1300 can also be modified to output current depending upon the specifications of the sensor. In a preferred embodiment, the digital-to-analog converter's resolution is 10 to 14 bits.

It is further noted that the digital-to-analog converter 130 may be a switch-capacitor digital-to-analog converter such as described in U.S. Pat. No. 5,563,597. The entire content of U.S. Pat. No. 5,563,597 is hereby incorporated by reference.

The analog-to-digital signal-conditioning device 1000 also includes a voltage reference 1400. Connected to the input of the digital-to-analog converter 1300 is DDS algorithm circuit 1520.

The DDS algorithm circuit 1520 generates sine waves from 100 kHz to 20 Hz with distortion below the digital-to-analog converter's least significant bit quantization noise. The frequency may be selectable with a 16-bit register value. It is noted that the 100 kHz to 20 Hz is a preferred range, but the concepts of the present invention are clearly applicable to higher or lower frequency applications.

It is noted that several DDS phase integrators can be used to generate multiple waveforms, which could be simply summed before going to the digital-to-analog converter 1300. This would allow more complicated system functions.

The output from the DDS algorithm circuit 1520 is also connected to a 90-degree phase shifter circuit 1480 and the input of a multiplier 1440.

In a preferred embodiment, since the sine wave is synchronous with the DDS algorithm circuit's output waveform, it is possible to compute the 90-degree shifted waveform inside the DDS algorithm circuit 1520 at the same time as the 0-degree phase waveform using a digital initial offset value of the phase accumulator.

Multiplier 1440 receives an input from analog-to-digital converter 1150 and multiplies the signal with the signal from the DDS algorithm circuit 1520, the product of which is fed to lowpass filter 1540. Moreover, multiplier 1460 receives an input from analog-to-digital converter 1150 and multiplies the signal with the signal from 90-degree phase shifter circuit 1480, the product of which is fed to lowpass filter 1560.

In one embodiment of the present invention, the lowpass filters 1540 and 1560 may be third order SINC filters. In some applications these filters may not be needed at all.

The lowpass filters 1540 and 1560 are each connected to a RMS circuit 1580 and 1600, respectively. The RMS circuit 1580 produces an In-Phase signal, and RMS circuit 1600 produces a Quadrature signal.

Figure 5:
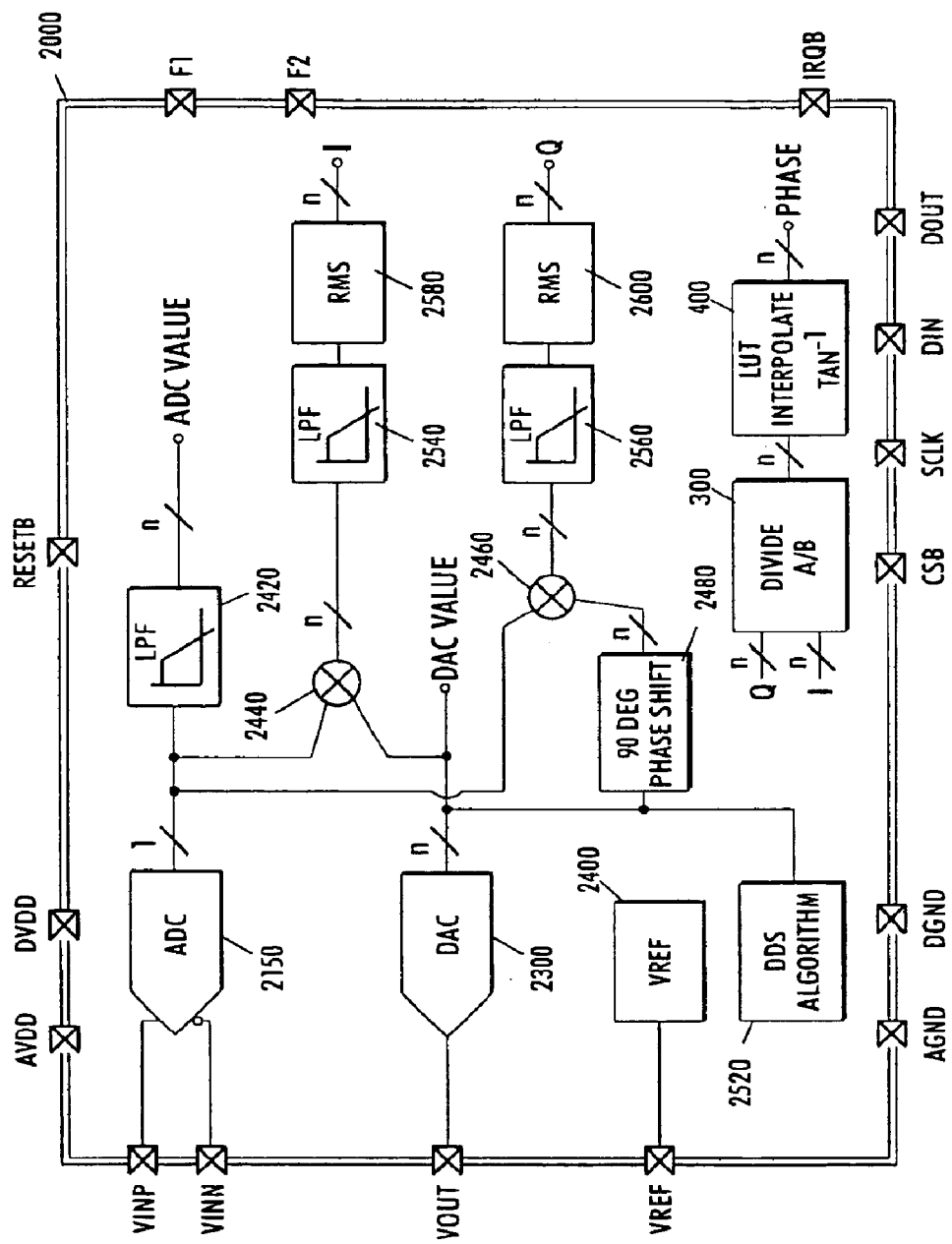
FIG. 5 is a schematic diagram of a further embodiment of a signal-conditioning analog-to-digital conversion circuit in accordance with the concepts of present invention.

FIG. 5 illustrates a third embodiment of the present invention. As illustrated in FIG. 5, an analog-to-digital signal-conditioning device 2000 receives analog signals from a sensor (not shown). The analog signals are initially received by an analog-to-digital converter 2150.

In a preferred embodiment of the present invention, as utilized in an energy metering product, an input sampling structure is used that allows "below the bottom" input voltage range. In this embodiment, the input voltage range of this structure would be −1.0V to 1.0V.

It is noted that a simple modification could raise the input common mode voltage to a voltage between 0.0V and roughly $V_{DD}/2$ In a metering product application, the single bit feedback is important because this application requires a very large linear dynamic range.

Alternatively, the analog-to-digital converter of the present invention could be implemented as a fast SAR type Nyquist converter. This embodiment would provide flatter RFI noise levels that are useful for applications needing a high sensor drive carrier frequency.

As further illustrated in FIG. 5, the analog-to-digital signal-conditioning device 2000 includes a digital-to-analog converter 2300. In one embodiment of the present invention, the digital-to-analog converter 2300 is the AD9831™ available from Analog Devices. This embodiment may also include the buffers of FIG. 2 to enhance signal conditioning.

The digital-to-analog converter 2300 of the present invention is capable of very fast settling. Moreover, the digital-to-analog converter 2300 would have an output that is fully differential with a common mode voltage around VDD/2.

It is noted that the digital-to-analog converter 2300 can also be modified to output current depending upon the specifications of the sensor. In a preferred embodiment, the digital-to-analog converter's resolution is 10 to 14 bits.

It is further noted that the digital-to-analog converter 130 may be a switch-capacitor digital-to-analog converter such as described in U.S. Pat. No. 5,563,597. The entire content of U.S. Pat. No. 5,563,597 is hereby incorporated by reference.

The analog-to-digital signal-conditioning device 2000 also includes a voltage reference 2400. Connected to the input of the digital-to-analog converter 2300 is DDS algorithm circuit 2520.

The DDS algorithm circuit 2520 generates sine waves from 100 kHz to 20 Hz with distortion below the digital-to-analog converter's least significant bit quantization noise. The frequency may be selectable with a 16-bit register value. It is noted that the 100 kHz to 20 Hz is a preferred range, but the concepts of the present invention are clearly applicable to higher or lower frequency applications.

It is noted that several DDS phase integrators can be used to generate multiple waveforms, which could be simply summed before going to the digital-to-analog converter 2300. This would allow more complicated system functions.

The output from the DDS algorithm circuit 2520 is also connected to a 90-degree phase shifter circuit 2480 and the input of a multiplier 2440.

In a preferred embodiment, since the sine wave is synchronous with the DDS algorithm circuit's output waveform, it is possible to compute the 90-degree shifted waveform inside the DDS algorithm circuit 2520 at the same time as the 0-degree phase waveform using a digital initial offset value of the phase accumulator.

Multiplier 2440 receives an input from analog-to-digital converter 2150 and multiplies the signal with the signal from the DDS algorithm circuit 2520, the product of which is fed to lowpass filter 2540. Moreover, multiplier 2460 receives an input from analog-to-digital converter 2150 and multiplies the signal with the signal from 90-degree phase shifter circuit 2480, the product of which is fed to lowpass filter 2560.

In one embodiment of the present invention, the lowpass filters 2540 and 2560 may be third order SINC filters. In some applications these filters may not be needed at all.

The lowpass filters 2540 and 2560 are each connected to a RMS circuit 2580 and 2600, respectively. The RMS circuit 2580 produces an In-Phase signal, and RMS circuit 2600 produces a Quadrature signal.

The In-Phase signal and Quadrature signal are fed to a digital to phase converter circuit including a dividing circuit 300 and a look-up table 400 for interpolating an arctan value. An example of the digital to phase converter circuit is illustrated in FIG. 4.

Figure 4:
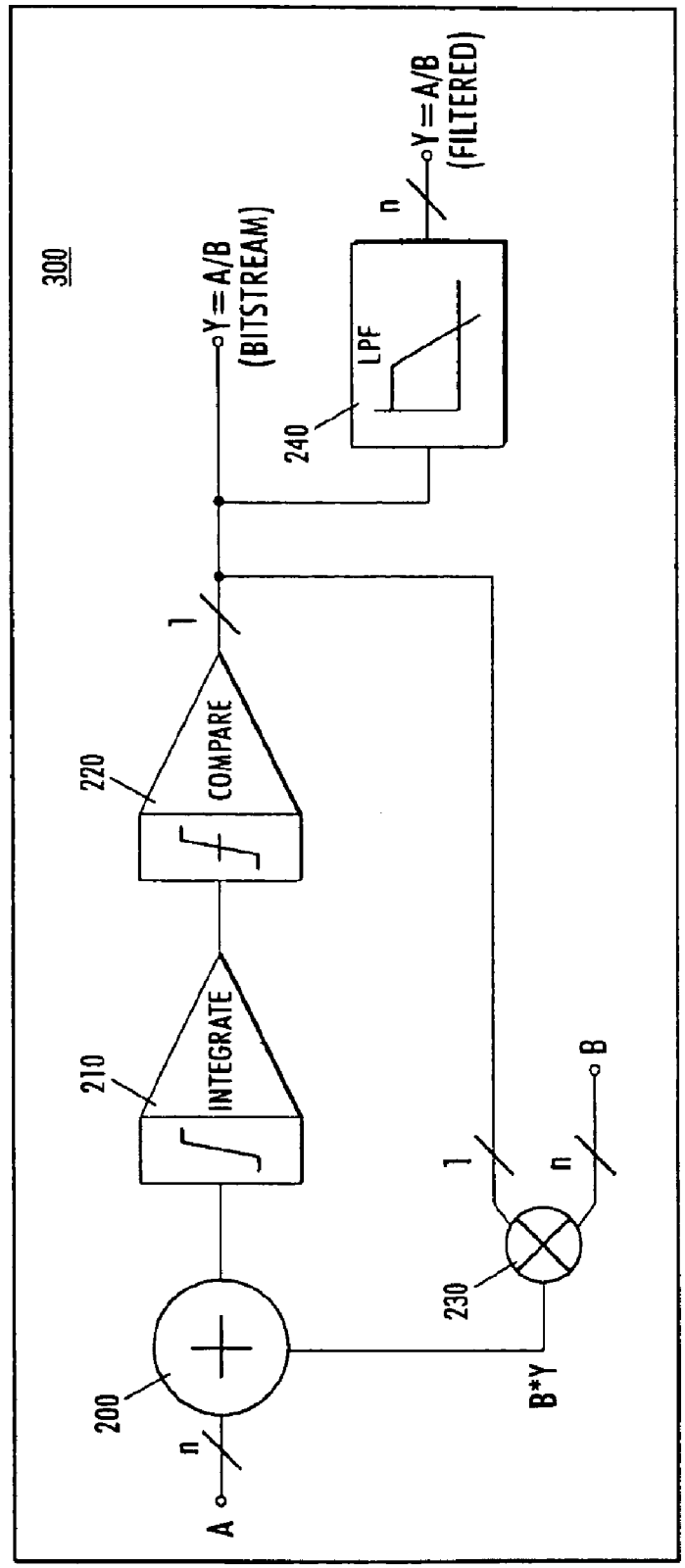
FIG. 4 is a schematic diagram of a divider block for a digital to phase converter circuit in accordance with the concepts of present invention.

As illustrated in FIG. 4, the Quadrature signal is fed to an adder 200 along with a signal from a multiplier 230 that produces a product from the In-Phase signal and a feedback of a ratio signal Y, corresponding to the In-Phase Signal to the Quadrature signal. The ratio signal Y is created by feeding the sum from adder 200 to an integration circuit 210 in series with a comparator circuit 220. Output from comparator 220 is feedback to the multiplier 230 and a filter circuit 240. The ratio value Y is a tangent value that can be utilized by the look-up table to determine the arctan value, thus the phase value. It is noted that this arctangent value could be determined continuously.

It is noted that the ratio of the In-Phase signal and the Quadrature signal can be calculated continually using a combination of the non-linear circuit described in U.S. Pat. No. 6,307,392 in combination with the four quadrant multiplication circuit as described in U.S. Pat. No. 5,862,069. The entire content of U.S. Pat. No. 6,307,392 and U.S. Pat. No. 5,862,069 are herby incorporated by reference.

Figure 6:
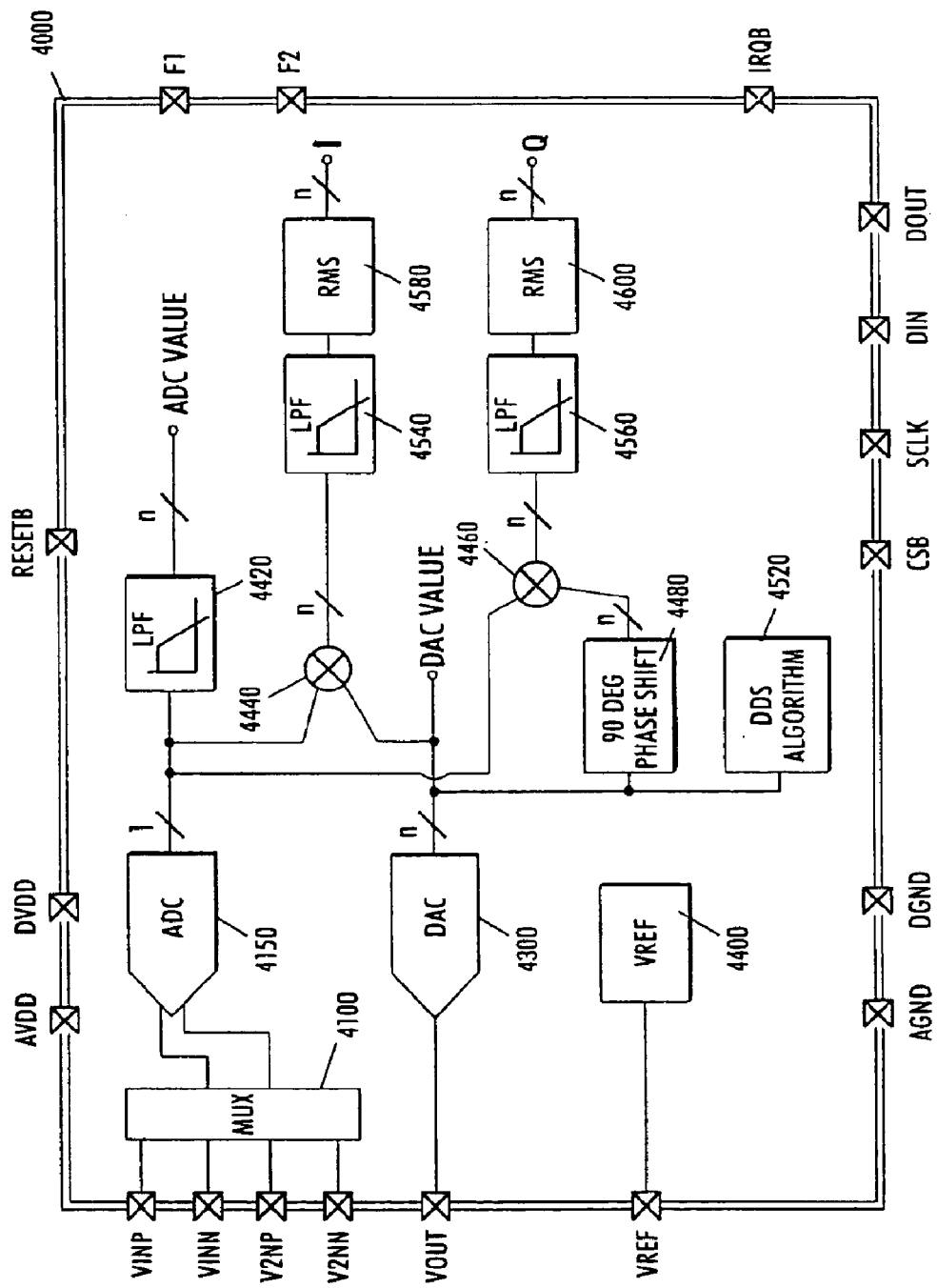
FIG. 6 is a schematic diagram of a further embodiment of a signal-conditioning analog-to-digital conversion circuit in accordance with the concepts of present invention.

FIG. 6 illustrates another embodiment of the present invention. As illustrated in FIG. 6, an analog-to-digital signal-conditioning device 4000 receives analog signals from a sensor (not shown). The analog signals from two or more channels are initially received by a multiplexer 4100 that switches between the channels and outputs the multiplexed or selected channels to an analog-to-digital converter 4150.

In a preferred embodiment of the present invention, as utilized in an energy metering product, an input sampling structure is used that allows "below the bottom" input voltage range. In this embodiment, the input voltage range of this structure would be −1.0V to 1.0V.

It is noted that a simple modification could raise the input common mode voltage to a voltage between 0.0V and roughly $V_{DD}/2$.

In a metering product application, the single bit feedback is important because this application requires a very large linear dynamic range.

Alternatively, the analog-to-digital converter of the present invention could be implemented as a fast SAR type Nyquist converter. This embodiment would provide flatter RFI noise levels that are useful for applications needing a high sensor drive carrier frequency.

As further illustrated in FIG. 6, the analog-to-digital signal-conditioning device 4000 includes a digital-to-analog converter 4300. In one embodiment of the present invention, the digital-to-analog converter 4300 is the AD9831™ available from Analog Devices. This embodiment may also include the buffers of FIG. 2 to enhance signal conditioning.

The digital-to-analog converter 4300 of the present invention is capable of very fast settling. Moreover, the digital-to-analog converter 4300 would have an output that is fully differential with a common mode voltage around VDD/2.

It is noted that the digital-to-analog converter 4300 can also be modified to output current depending upon the specifications of the sensor. In a preferred embodiment, the digital-to-analog converter's resolution is 10 to 14 bits.

It is further noted that the digital-to-analog converter 4300 may be a switch-capacitor digital-to-analog converter such as described in U.S. Pat. No. 5,563,597. The entire content of U.S. Pat. No. 5,563,597 is hereby incorporated by reference.

The analog-to-digital signal-conditioning device 4000 also includes a voltage reference 4400. Connected to the input of the digital-to-analog converter 4300 is DDS algorithm circuit 4520.

The DDS algorithm circuit 4520 generates sine waves from 100 kHz to 20 Hz with distortion below the digital-to-analog converter's least significant bit quantization noise. The frequency may be selectable with a 16-bit register value. It is noted that the 100 kHz to 20 Hz is a preferred range, but the concepts of the present invention are clearly applicable to higher or lower frequency applications.

It is noted that several DDS phase integrators can be used to generate multiple waveforms, which could be simply summed before going to the digital-to-analog converter 4300. This would allow more complicated system functions.

The output from the DDS algorithm circuit 4520 is also connected to a 90-degree phase shifter circuit 4480 and the input of a multiplier 4440.

In a preferred embodiment, since the sine wave is synchronous with the DDS algorithm circuit's output waveform, it is possible to compute the 90-degree shifted waveform inside the DDS algorithm circuit 4520 at the same time as the 0-degree phase waveform using a digital initial offset value of the phase accumulator.

Multiplier 4440 receives an input from analog-to-digital converter 4150 and multiplies the signal with the signal from the DDS algorithm circuit 4520, the product of which is fed to lowpass filter 4540. Moreover, multiplier 4460 receives an input from analog-to-digital converter 4150 and multiplies the signal with the signal from 90-degree phase shifter circuit 4480, the product of which is fed to lowpass filter 4560.

In one embodiment of the present invention, the lowpass filters 1540 and 1560 may be third order SINC filters. In some applications these filters may not be needed at all.

The lowpass filters 4540 and 4560 are each connected to a RMS circuit 4580 and 4600, respectively. The RMS circuit 4580 produces an In-Phase signal, and RMS circuit 4600 produces a Quadrature signal.

Figure 7:
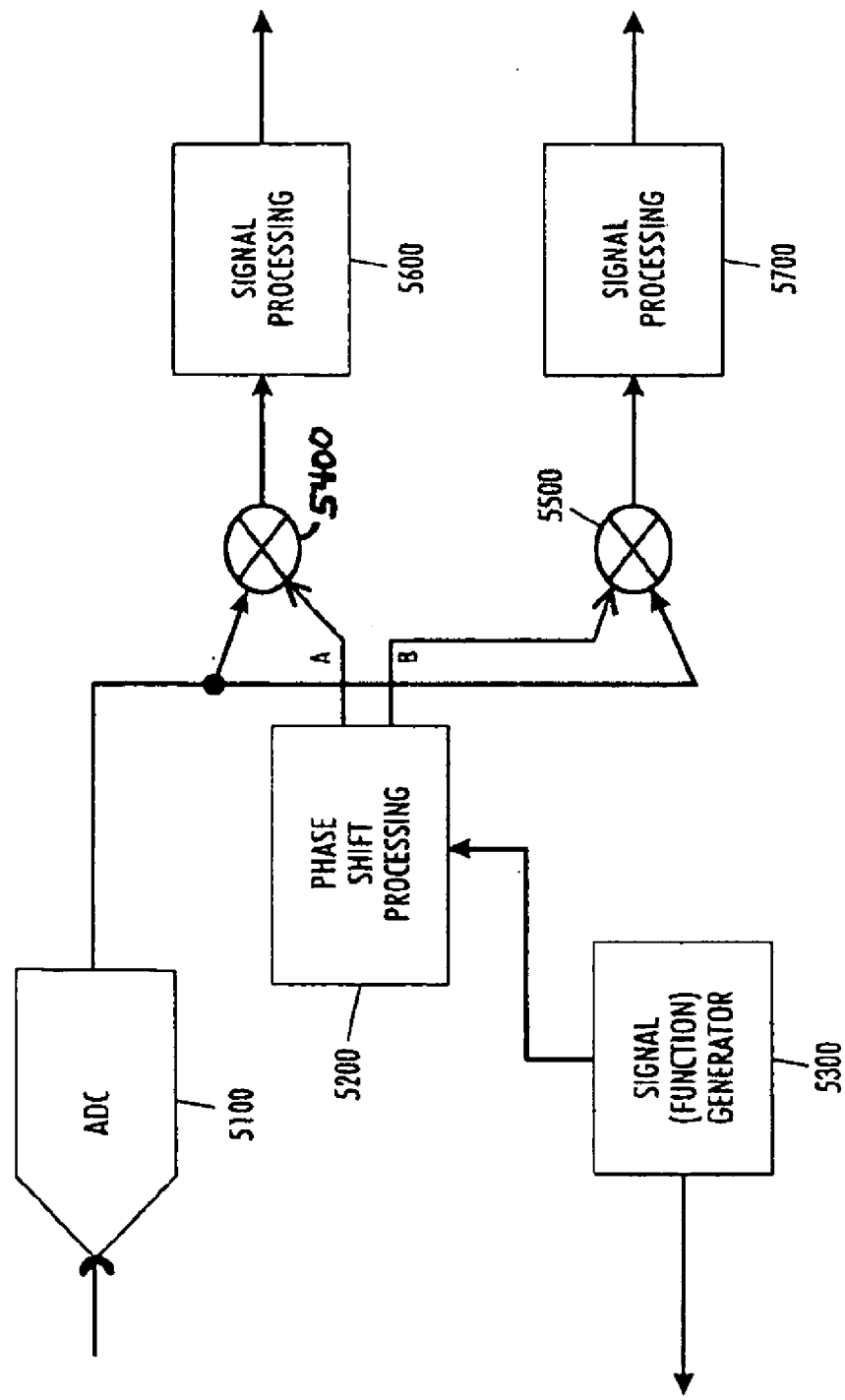
FIG. 7 is a schematic diagram of a further embodiment of a signal-conditioning analog-to-digital conversion circuit in accordance with the concepts of present invention.

FIG. 7 illustrates another embodiment of the present invention. As illustrated in FIG. 7, an analog-to-digital converter 5100 receives analog signals from a sensor (not shown). It is noted that analog signals from two or more channels can be received by utilizing a multiplexer, located up stream of the analog-to-digital converter 5100, that switches between the channels and outputs the multiplexed or selected channels to the analog-to-digital converter 5100.

As further illustrated in FIG. 7, a signal (function) generator 5300 produces an excitation signal (analog) that is used in driving a sensor. The signal (function) generator 5300 also produces a digital signal representing the analog excitation signal that is fed to an optional phase shift processing circuit 5200. This embodiment may also include the buffers and/or filters that enhance the signal conditioning of the analog excitation signal.

The optional phase shift processing circuit 5200 can produce multiple signals being shifted in phase from each other. In a preferred embodiment, as illustrated in FIG. 7, the optional phase shift processing circuit 5200 produces zero-degree phase shifted signal A and 90-degree phase shifted signal B.

Multiplier (demodulator) 5400 receives, as illustrated in FIG. 7, an input from analog-to-digital converter 5100 and multiplies this input with signal A from optional phase shift processing circuit 5200, the product of which is fed to an optional signal processing circuit 5600 that may include lowpass filters, etc. If the optional phase shift processing circuit 5200 is not included in the circuit, multiplier (demodulator) 5400 receives an input from analog-to-digital converter 5100 and multiplies this input with the digital signal from the signal (function) generator 5300.

Moreover, optional multiplier (demodulator) 5500 receives, as illustrated in FIG. 7, an input from analog-to-digital converter 5100 and multiplies this input with signal B from optional phase shift processing circuit 5200, the product of which is fed to an optional signal processing circuit 5700 that may include lowpass filters, etc.

Figure 8:
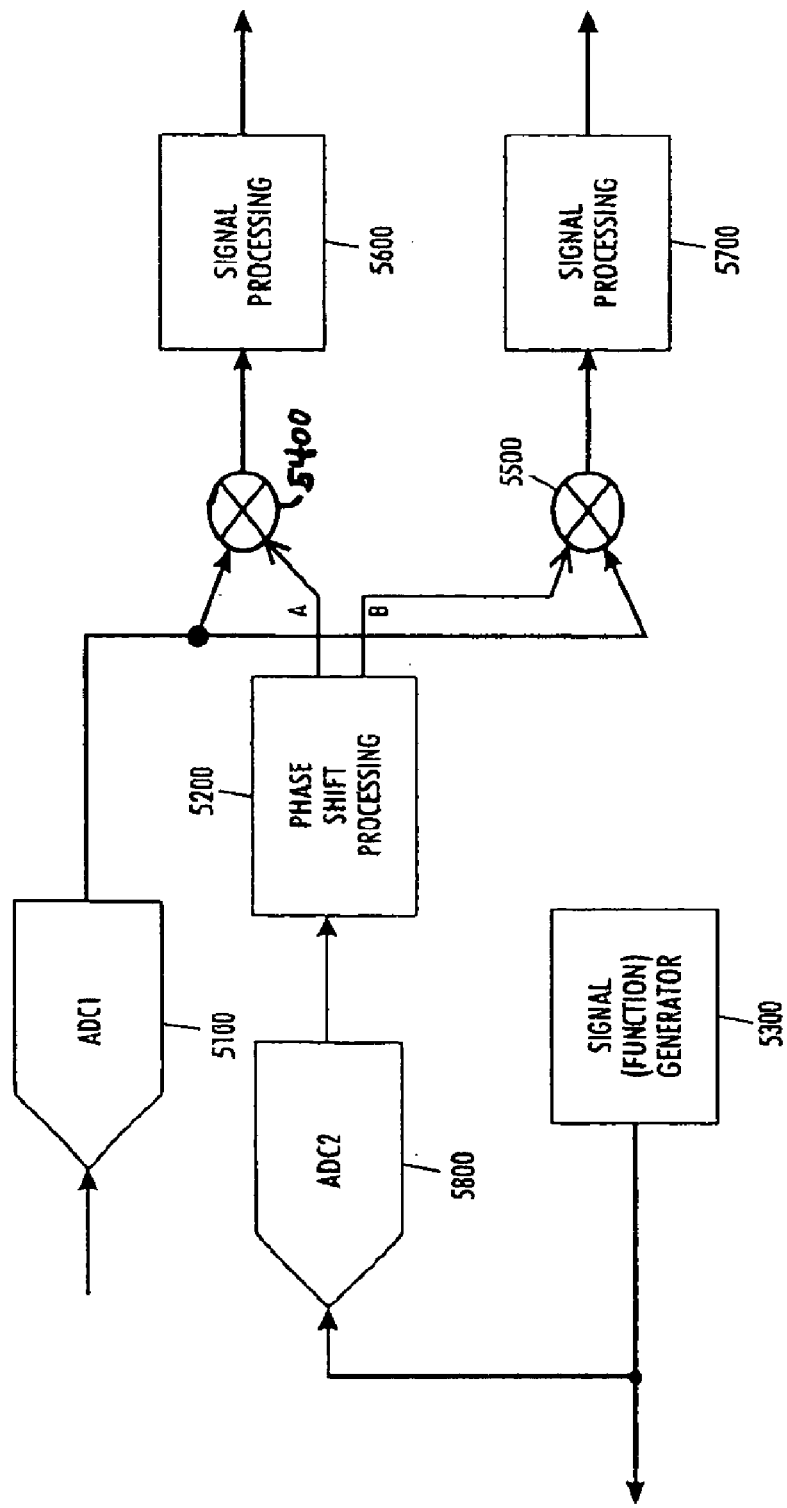
FIG. 8 is a schematic diagram of a further embodiment of a signal-conditioning analog-to-digital conversion circuit in accordance with the concepts of present invention.

FIG. 8 illustrates another embodiment of the present invention. As illustrated in FIG. 8, an analog-to-digital converter 5100 receives analog signals from a sensor (not shown). It is noted that analog signals from two or more channels can be received by utilizing a multiplexer, located up stream of the analog-to-digital converter 5100, that switches between the channels and outputs the multiplexed or selected channels to the analog-to-digital converter 5100.

As further illustrated in FIG. 8, a signal (function) generator 5300 produces an excitation signal (analog) that is used in driving a sensor. A second analog-to-digital converter 5800 also receives the analog excitation signal and produces a digital signal representing the analog excitation signal that is fed to an optional phase shift processing circuit 5200. This embodiment may also include the buffers and/or filters that enhance the signal conditioning of the analog excitation signal before it is converted by the second analog-to-digital converter 5800.

The optional phase shift processing circuit 5200 can produce multiple signals being shifted in phase from each other. In a preferred embodiment, as illustrated in FIG. 8, the optional phase shift processing circuit 5200 produces zero-degree phase shifted signal A and 90-degree phase shifted signal B.

Multiplier (demodulator) 5400 receives, as illustrated in FIG. 8, an input from analog-to-digital converter 5100 and multiplies this input with signal A from optional phase shift processing circuit 5200, the product of which is fed to an optional signal processing circuit 5600 that may include lowpass filters, etc. If the optional phase shift processing circuit 5200 is not included in the circuit, multiplier (demodulator) 5400 receives an input from analog-to-digital converter 5100 and multiplies this input with the digital signal from the signal (function) generator 5300.

Moreover, optional multiplier (demodulator) 5500 receives, as illustrated in FIG. 8, an input from analog-to-digital converter 5100 and multiplies this input with signal B from optional phase shift processing circuit 5200, the product of which is fed to an optional signal processing circuit 5700 that may include lowpass filters, etc.

Figure 9:
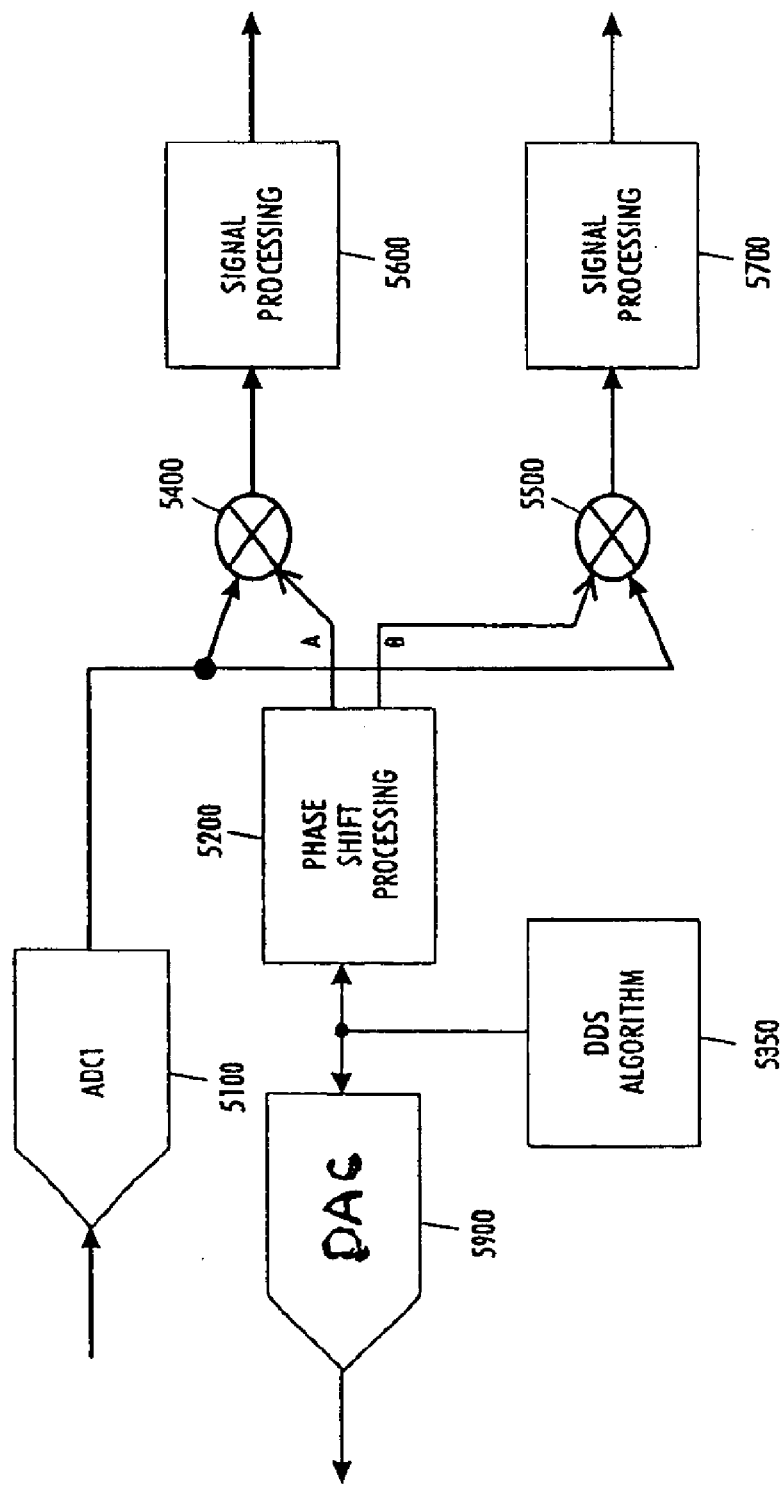
FIG. 9 is a schematic diagram of a further embodiment of a signal-conditioning analog-to-digital conversion circuit in accordance with the concepts of present invention.

FIG. 9 illustrates another embodiment of the present invention. As illustrated in FIG. 9, an analog-to-digital converter 5100 receives analog signals from a sensor (not shown). It is noted that analog signals from two or more channels can be received by utilizing a multiplexer, located up stream of the analog-to-digital converter 5100, that switches between the channels and outputs the multiplexed or selected channels to the analog-to-digital converter 5100.

As further illustrated in FIG. 9, a DDS algorithm 5350 produces a digital signal that represents an analog excitation signal, the analog excitation signal being used in driving a sensor. A digital-to-analog-converter 5900 receives digital signal representing the analog excitation signal and converts it into an analog excitation signal. The digital signal representing the analog excitation signal is also fed to an optional phase shift processing circuit 5200. This embodiment may also include the buffers and/or filters that enhance the signal conditioning of the analog excitation signal as it leaves the digital-to-analog converter 5900.

The optional phase shift processing circuit 5200 can produce multiple signals being shifted in phase from each other. In a preferred embodiment, as illustrated in FIG. 9, the optional phase shift processing circuit 5200 produces zero-degree phase shifted signal A and 90-degree phase shifted signal B.

Multiplier (demodulator) 5400 receives, as illustrated in FIG. 9, an input from analog-to-digital converter 5100 and multiplies this input with signal A from optional phase shift processing circuit 5200, the product of which is fed to an optional signal processing circuit 5600 that may include lowpass filters, etc. If the optional phase shift processing circuit 5200 is not included in the circuit, multiplier (demodulator) 5400 receives an input from analog-to-digital converter 5100 and multiplies this input with the digital signal from the signal (function) generator 5300.

Moreover, optional multiplier (demodulator) 5500 receives, as illustrated in FIG. 9, an input from analog-to-digital converter 5100 and multiplies this input with signal B from optional phase shift processing circuit 5200, the product of which is fed to an optional signal processing circuit 5700 that may include lowpass filters, etc.

Figure 10:
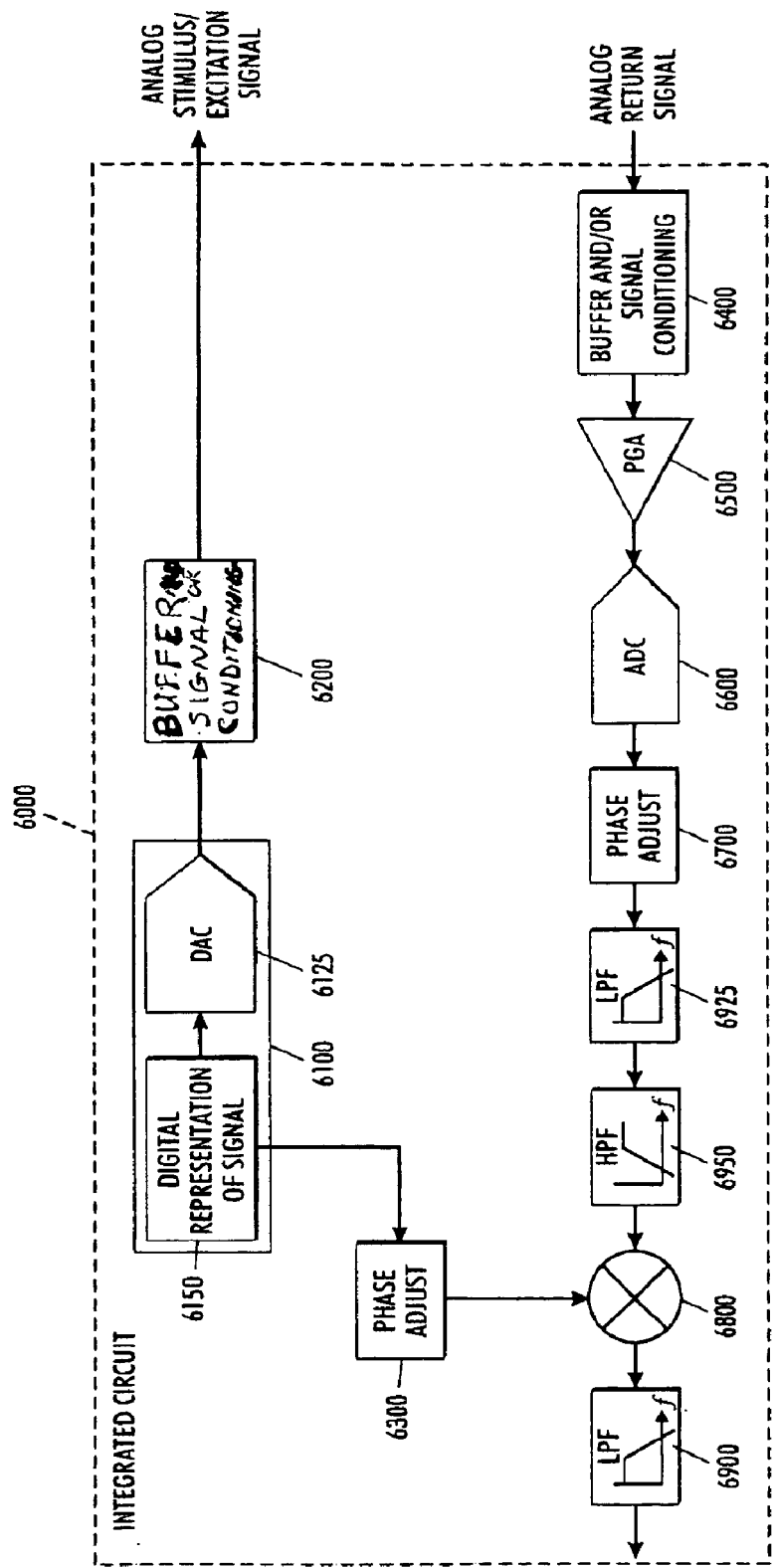
FIG. 10 is a schematic diagram of a further embodiment of a signal-conditioning analog-to-digital conversion circuit in accordance with the concepts of present invention.

FIG. 10 illustrates another embodiment of the present invention. As illustrated in FIG. 10, an integrated circuit 6000 includes a signal generator subsystem 6100 that operates as a function generator for an analog excitation signal that eventually leaves the integrated circuit. In this embodiment, a digital signal from a digital signal source 6150 drives a digital-to-analog converter 6125 to generate the analog excitation signal. It is noted that the digital-to-analog converter 6125 could be as simple as an inverter (1-bit digital-to-analog converter). The digital-to-analog converter 6125 could produce a current output or voltage output. The digital signal source 6150 could be a DDS (direct digital synthesis), a ROM, or other memory storing the digital representation of a periodic excitation signal or other predetermined waveform or signal.

According to the concepts of the present invention with respect to this embodiment, the digital signal from the digital signal source 6150 is passed from a signal generator subsystem 6100 to a multiplication block (demodulator) 6800 for digital multiplication.

It is noted that the analog signal generation techniques discussed above could also be used to generate a clock signal, sinusoidal oscillation, or arbitrary waveform. In addition, an external crystal combined with on-board control circuitry could generate the analog signal.

It is further noted that the signal output from the digital-to-analog converter 6125 may need to be buffered or filtered with an on-board buffer and/or signal-conditioning (active or passive filtering) provided by optional signal conditioning circuit 6200.

The analog signal received from a sensor or other source that the integrated circuit 6000 is metering may require buffering and/or filtering. Thus, as illustrated in FIG. 10, an optional signal conditioning circuit 6400 initially processes the received analog signal. It is noted that an instrumentation amplifier could be considered a buffer in this system.

After optional signal conditioning, the analog signal may be amplified by an optional programmable gain amplifier 6500. An analog-to-digital converter 6600 converts the received analog signal to a digital representation thereof. The analog-to-digital converter 6600 may be a sigma-delta converter or SAR or any type of converter.

Phase adjustment of the digital signals may be realized by including optional phase adjustment circuit 6700 and/or phase adjustment circuit 6300. It is noted that the present invention contemplates a plurality of demodulation paths with different phase adjustments as an option; i.e., one path with 0 degrees phase and another path with 90 degrees phase.

An optional lowpass filter 6925 and/or highpass filter 6950 may be placed somewhere after the analog-to-digital converter 6600 and before multiplier 6800.

Eventually, the digital signal from the analog-to-digital converter 6600 and the digital signal from the digital signal source 6150 are multiplied or demodulated by multiplier 6800. It is noted that multiplier 6800 may use a single-bit stream from a sigma-delta analog-to-digital converter (if using a sigma-delta) to achieve a much more simplified circuit implementation of the multiplier 6800.

An optional low-pass filter 6900 can be placed somewhere after the multiplier 6800. The filter is optional because the digital output might be filtered on another integrated circuit (such as a micro-controller).

It is noted that the above implementation of the present invention is all within a single integrated circuit; i.e., a specific integrated circuit with dedicated circuitry—no microcontroller is used to implement the stated signal chain. Also, it is noted that additional signal processing may be placed after the multiplier 6800 and optional low-pass filter 6900.

Figure 11:
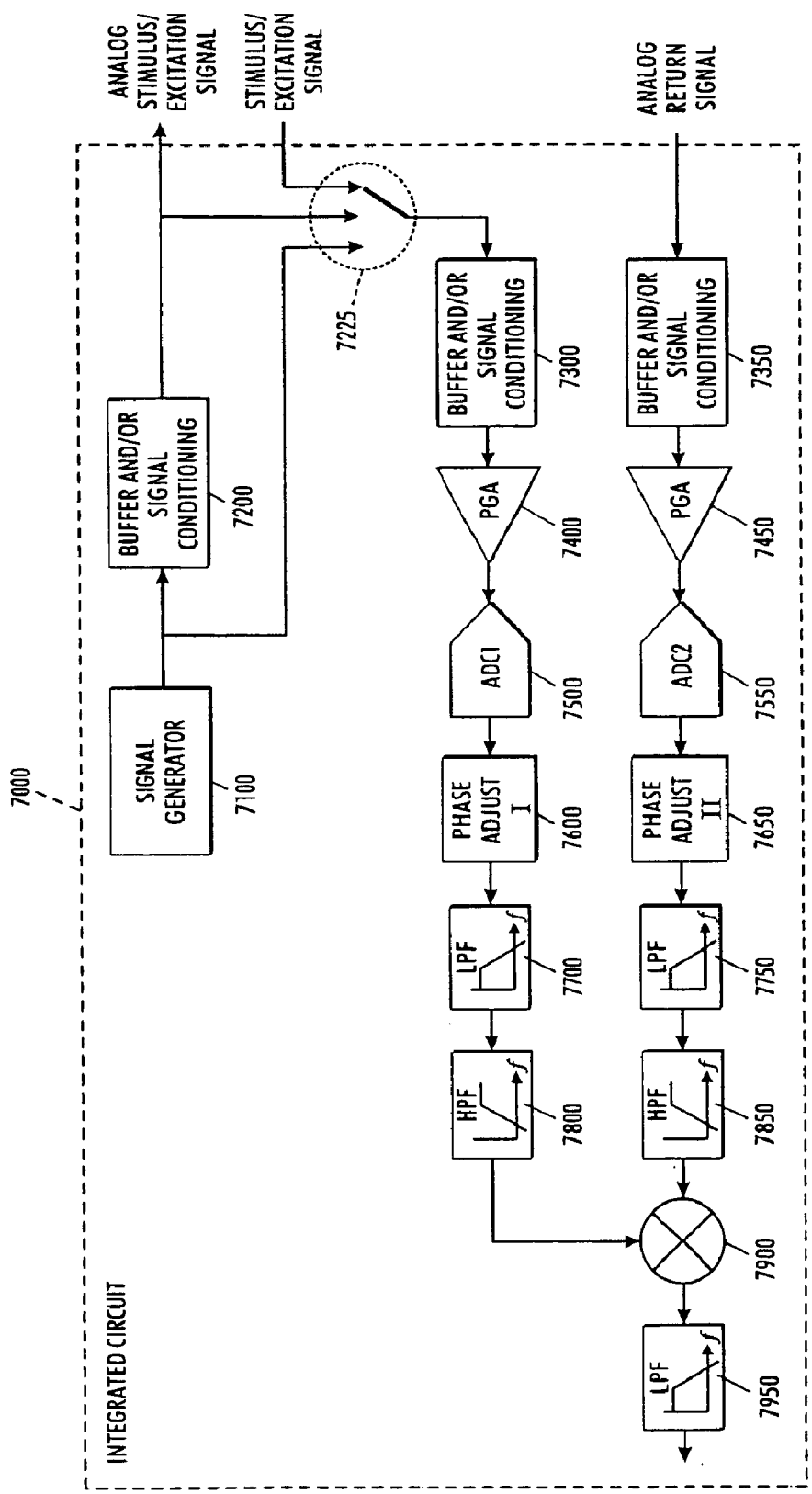
FIG. 11 is a schematic diagram of a further embodiment of a signal-conditioning analog-to-digital conversion circuit in accordance with the concepts of present invention.

FIG. 11 illustrates another embodiment of the present invention. As illustrated in FIG. 11, an integrated circuit 7000 includes a signal generator 7100 that operates as a function generator for an analog excitation signal that eventually leaves the integrated circuit. This embodiment is different from the one illustrated in FIG. 10 in that analog excitation signal is passed through an analog-to-digital converter 7500 back to multiplier 7900 versus being directly passed digitally. This embodiment provides the benefit of matching the phase of the drive signal that could have been phase-shifted through the digital-to-analog converter and optional output buffers and filtering of FIG. 10.

In this embodiment, the analog excitation signal from the signal generator 7100 could be derived from a digital signal from a digital signal source that drives a digital-to-analog converter to generate the analog excitation signal. It is noted that the digital-to-analog converter could be as simple as an inverter (1-bit digital-to-analog converter). The digital-to-analog converter could produce a current output or voltage output. The digital signal source could be a DDS (direct digital synthesis), a ROM, or other memory storing the digital representation of a periodic excitation signal or other predetermined waveform or signal.

It is noted that the analog signal generation techniques discussed above could also be used to generate a clock signal, sinusoidal oscillation, or arbitrary waveform. In addition, an external crystal combined with on-board control circuitry could generate the analog signal.

It is further noted that the signal output from the signal generator 7100 may need to be buffered or filtered with an on-board buffer and/or signal-conditioning (active or passive filtering) provided by optional signal conditioning circuit 7200.

The analog signal received from a sensor or other source that the integrated circuit 7000 is metering may require buffering and/or filtering. Thus, as illustrated in FIG. 11, an optional signal conditioning circuit 7350 initially processes the received analog signal. It is noted that an instrumentation amplifier could be considered a buffer in this system.

After optional signal conditioning, the analog signal may be amplified by an optional programmable gain amplifier 7450. An analog-to-digital converter 7550 converts the received analog signal to a digital representation thereof. The analog-to-digital converter 7550 may be a sigma-delta converter or SAR or any type of converter.

Phase adjustment of the digital signal may be realized by including optional phase adjustment circuit 7650. It is noted that the present invention contemplates a plurality of demodulation paths with different phase adjustments as an option; i.e., one path with 0 degrees phase and another path with 90 degrees phase.

An optional lowpass filter 7750 and/or highpass filter 7850 may be placed somewhere after the analog-to-digital converter 7550 and before multiplier 7900.

The analog excitation signal received from the signal generator 7100, signal conditioning circuit 7200, or off-chip may require buffering and/or filtering. Thus, as illustrated in FIG. 11, an optional signal conditioning circuit 7300 initially processes the received analog signal.

It is noted that the selection of the tapping of the analog excitation signal is driven by the designer requirements. It is noted that the integrated circuit could optionally include a switch or multiplexer 7225 that allows the switching between the various analog excitation signals to be used in demodulation.

After optional signal conditioning, the analog excitation signal may be amplified by an optional programmable gain amplifier 7400. An analog-to-digital converter 7500 converts the received analog excitation signal to a digital representation thereof. The analog-to-digital converter 7500 may be a sigma-delta converter or SAR or any type of converter.

Phase adjustment of the digital excitation signal may be realized by including optional phase adjustment circuit 7600. It is noted that the present invention contemplates a plurality of demodulation paths with different phase adjustments as an option; i.e., one path with 0 degrees phase and another path with 90 degrees phase.

An optional lowpass filter 7700 and/or highpass filter 7800 may be placed somewhere after the analog-to-digital converter 7500 and before multiplier 7900.

Eventually, the digital excitation signal from the analog-to-digital converter 7500 and the digital signal from the analog-to-digital converter 7550 are multiplied or demodulated by multiplier 7900. It is noted that multiplier 7900 may use a single-bit stream from a sigma-delta analog-to-digital converter (if using a sigma-delta) to achieve a much more simplified circuit implementation of the multiplier 7900.

An optional low-pass filter 7950 can be placed somewhere after the multiplier 7900. The filter is optional because the digital output might be filtered on another integrated circuit (such as a micro-controller).

It is noted that the above implementation of the present invention is all within a single integrated circuit; i.e., a specific integrated circuit with dedicated circuitry—no microcontroller is used to implement the stated signal chain. Also, it is noted that additional signal processing may be placed after the multiplier 7900 and optional low-pass filter 7950.

It is further noted that analog-to-digital converter 7500 and analog-to-digital converter 7550 may not necessarily be the same type of converters.

There is no easy way to calculate an arbitrary arctangent value. Using a microprocessor or digital signal processor might be a feasible, but in dedicated hardware it is too complicated. Thus the present invention, in the preferred embodiment, utilizes a look-up table. In such a design, if necessary, interpolation can be used between table entries. In this way, the present invention determines the angle range required and therefore the arctangent table range and accuracy. It is noted that other methods are possible for calculating the arctangent value, such as a Taylor Series expansion.

Other modifications of the present invention may include having a serial port configured to read all internal busses or registers such as I, Q, DAC, ADC1, ADC2. The protocol could be either SPI or 12C, or both. An IRQb interrupt output pin signal could be used for synchronizing data reads to sampling rates.

The present invention may use two-channel pulse output with programmable scaling, slow output frequency for mean values, and fast output frequencies for waveform reconstruction. The format for these outputs could be either frequency or pulse width modulation.

In accordance with the concepts of the present invention, since bridge gain is dependent on the drive amplitude, various compensation schemes are possible which vary the bridge drive amplitude [DC or AC] in response to measured values. Moreover, the present invention true RMS calculations can have a selectable mean settling time if necessary.

If the DDS algorithm is small enough, it is possible to have the digital-to-analog converter's output to be the sum of several sine waves. The present invention could use the analog-to-digital converter value to adjust the digital-to-analog converter's output amplitude with negative feedback to implement a force-sense scheme using averaged values such as RMS. It may be possible to implement this scheme as automatic background compensation.

The present invention provides the capability of bridge balance compensation by comparison of terminal voltages at the analog inputs. This comparison could be either instantaneous and average DC voltages or AC RMS levels, depending on the requirements.

Though the present invention has been described as using a DDS sine wave generation for the bridge drive, the present invention could also have utilized a waveform RAM array for an arbitrary waveform drive shape.

If modulator input multiplexing is used in the present invention, it is possible to have more than one differential input. In addition, the differential input could be multiplexed into three inputs: differential voltage value, and two terminal voltage values. This would allow continuous measurement of differential and terminal voltage values without affecting the input signal path but still result in high sampling frequency bit streams to use for filtering, calculations such as RMS, or error correction algorithms.

While various examples and embodiments of the present invention have been shown and described, it will be appreciated by those skilled in the art that the spirit and scope of the present invention are not limited to the specific description and drawings herein, but extend to various modifications and changes.

What is claimed is:

1. An analog-to-digital device, comprising:
    a first programmable gain amplifier to amplify a first voltage signal from a first channel;
    a second programmable gain amplifier to amplify a second voltage signal from a second channel;
    a first analog-to-digital converter to convert the amplified first voltage signal to a first digital signal;
    a second analog-to-digital converter to convert the amplified second voltage signal to a second digital signal;
    a first lowpass filter circuit, receiving said first and second digital signals, to generate, therefrom, a filtered digital signal;
    a direct digital synthesizer to generate a third digital signal representing a predetermined waveform;
    a first multiplier to multiply said second voltage signal and said digital signal representing the predetermined waveform to generate a digital value;
    a phase shifter circuit, operatively connected to said first multiplier, to generate a signal representing a 90-degree phase shift of said digital value;
    a second multiplier, operatively connected to said phase shifter circuit and said first analog-to-digital converter, to multiply the signals therefrom and to produce a 90-degree phase signal;
    a third multiplier, operatively connected to said first multiplier and said first analog-to-digital converter, to multiply the signals therefrom and to produce a zero degree phase signal;
    a second lowpass filter circuit, operatively connected to said second and third multipliers, to filter said 90 degree and zero degree phase signals;
    a first root-mean-square circuit to convert the filtered zero degree phase digital signal into an In-Phase signal; and
    a second root-mean-square circuit to convert the filtered 90-degree phase digital signal into a Quadrature signal.

2. The analog-to-digital device, as claimed in claim 1, further comprising:
    a multiplexer, operatively connected to said first and second analog-to-digital converters and said first lowpass filter circuit, to multiplex said first and second digital signals to said first lowpass filter circuit.

3. The analog-to-digital device, as claimed in claim 1, further comprising:
    a digital-to-frequency converter, operatively connected to said first low pass filter circuit and said second root-mean-square circuit, to generate a frequency signal therefrom.

4. The analog-to-digital device, as claimed in claim 1, further comprising:
    a digital-to-frequency converter, operatively connected to said first and second root-mean-square circuits, to generate a frequency signal therefrom.

5. The analog-to-digital device, as claimed in claim 1, further comprising:
    a digital-to-phase converter, operatively connected to said first and second root-mean-square circuits, to generate a phase signal therefrom.

6. The analog-to-digital device, as claimed in claim 1, further comprising:
    a digital-to-phase converter, operatively connected to said first and second root-mean-square circuits, to generate a continuous phase signal therefrom.

7. The analog-to-digital device as claimed in claim 6, wherein said digital-to-phase converter includes a dividing circuit, operatively connected to said first and second root-mean-square circuits, and a look-up table, operatively connected to said dividing circuit, to generate a phase value.

8. The analog-to-digital device, as claimed in claim 1, further comprising:
    a first digital-to-frequency converter, operatively connected to said first low pass filter circuit and said second root-mean-square circuit, to generate a first frequency signal therefrom; and
    a second digital-to-frequency converter, operatively connected to said first and second root-mean-square circuits, to generate a second frequency signal therefrom.

9. The analog-to-digital device, as claimed in claim 3, further comprising:
    a multiplexer, operatively connected to said first low pass filter circuit and said second root-mean-square circuit, to multiplex said filtered digital signal and said Quadrature signal to said digital-to-frequency converter.

10. The analog-to-digital device, as claimed in claim 4, further comprising:
   a multiplexer, operatively connected to said first and second root-mean-square circuits, to multiplex said In-Phase signal and said Quadrature signal to said digital-to-frequency converter.

11. The analog-to-digital device, as claimed in claim 7, further comprising:
   a first multiplexer, operatively connected to said first low pass filter circuit and said second root-mean-square circuit, to multiplex said filtered digital signal and said Quadrature signal to said digital-to-frequency converter; and
   a second multiplexer, operatively connected to said first and second root-mean-square circuits, to multiplex said In-Phase signal and said Quadrature signal to said digital-to-frequency converter.

12. The analog-to-digital device, as claimed in claim 1, further comprising:
   a digital-to-analog converter, operatively connected to said direct digital synthesizer, to convert said digital value to an analog signal.

13. The analog-to-digital device, as claimed in claim 1, wherein said predetermined waveform is a sine waveform.

14. The analog-to-digital device, as claimed in claim 1, wherein said predetermined waveform is a complex waveform.

15. The analog-to-digital device, as claimed in claim 1, wherein said predetermined waveform is a non-sine waveform.

16. The analog-to-digital device as claimed in claim 1, wherein said first multiplier includes a lowpass filter to filter the product produced therefrom.

17. An analog-to-digital device, comprising:
   an analog-to-digital converter to convert an analog voltage signal to a digital signal;
   a first lowpass filter circuit, receiving said digital signal, to generate, therefrom, a filtered digital signal;
   a direct digital synthesizer to generate a digital signal representing a predetermined waveform;
   a phase shifter circuit, operatively connected to said direct digital synthesizer, to generate a signal representing a 90-degree phase shift of said predetermined waveform;
   a first multiplier, operatively connected to said phase shifter circuit and said analog-to-digital converter, to multiply the signals therefrom and to produce a 90-degree phase signal;
   a second multiplier, operatively connected to said direct digital synthesizer and said analog-to-digital converter, to multiply the signals therefrom and to produce a zero degree phase signal;
   a second lowpass filter circuit, operatively connected to said first and second multipliers, to filter said 90 degree and zero degree phase signals;
   a first root-mean-square circuit to convert the filtered zero degree phase digital signal into an In-Phase signal; and
   a second root-mean-square circuit to convert the filtered 90-degree phase digital signal into a Quadrature signal.

18. The analog-to-digital device, as claimed in claim 17, further comprising:
   a digital-to-frequency converter, operatively connected to said first and second root-mean-square circuits, to generate a frequency signal therefrom.

19. The analog-to-digital device, as claimed in claim 17, further comprising:
   a digital-to-phase converter, operatively connected to said first and second root-mean-square circuits, to generate a phase signal therefrom.

20. The analog-to-digital device, as claimed in claim 17, further comprising:
   a digital-to-phase converter, operatively connected to said first and second root-mean-square circuits, to generate a continuous phase signal therefrom.

21. The analog-to-digital device as claimed in claim 20, wherein said digital-to-phase converter includes a dividing circuit, operatively connected to said first and second root-mean-square circuits, and a look-up table, operatively connected to said dividing circuit, to generate a phase value.

22. The analog-to-digital device, as claimed in claim 17, further comprising:
   a multiplexer to multiplex between multiple channels having analog signals thereon such that an analog signal from one channel of the multiple channels is fed to said analog-to-digital converter.

23. The analog-to-digital device, as claimed in claim 17, further comprising:
   a programmable gain amplifier to amplify the analog signal and to feed the amplified analog signal to said analog-to-digital converter.

24. The analog-to-digital device, as claimed in claim 17, further comprising:
   a digital-to-analog converter, operatively connected to said direct digital synthesizer, to convert said digital value to an analog signal.

25. An integrated circuit, comprising:
   a first analog-to-digital converter to convert a first analog signal to a first digital signal;
   a signal generator to generate an analog excitation signal;
   a second analog-to-digital converter to convert said analog excitation signal to a second digital signal; and
   a multiplier, operatively connected to said first and second analog-to-digital converters, to multiply the signals therefrom.

26. The integrated circuit as claimed in claim 25, further comprising:
   a multiplexer to multiplex between multiple channels having analog signals thereon such that an analog signal from one channel of the multiple channels is fed to said first analog-to-digital converter as said first analog signal.

27. The integrated circuit as claimed in claim 25, further comprising:
   a programmable gain amplifier to amplify said first analog signal and to feed the amplified first analog signal to said first analog-to-digital converter.

28. The integrated circuit as claimed in claim 25, further comprising:
   a phase adjustment circuit, operatively connected between said second analog-to-digital converter and said multiplier, to adjust the phase of said second digital signal.

29. The integrated circuit as claimed in claim 25, further comprising:
   a phase adjustment circuit, operatively connected between said first analog-to-digital converter and said multiplier, to adjust the phase of said first digital signal.

30. The integrated circuit as claimed in claim 25, further comprising:
- a first phase adjustment circuit, operatively connected between said second analog-to-digital converter and said multiplier, to adjust the phase of said second digital signal; and
- a second phase adjustment circuit, operatively connected between said first analog-to-digital converter and said multiplier, to adjust the phase of said first digital signal.

31. The integrated circuit as claimed in claim 25, further comprising:
- a phase adjustment circuit, operatively connected between said second analog-to-digital converter and said multiplier, to adjust the phase of said second digital signal and to produce a first phase adjusted signal and a second phase adjusted signal;
- a second multiplier, operatively connected to said first analog-to-digital converter and said phase adjustment circuit, to multiply said first digital signal with said first phase adjusted signal;
- said multiplier being operatively connected to said first analog-to-digital converter and said phase adjustment circuit, to multiply said first digital signal with said second phase adjusted signal.

32. The integrated circuit as claimed in claim 25, further comprising:
- a lowpass filter circuit, operatively connected to said multiplier, to filter the signal received from said multiplier.

33. The integrated circuit as claimed in claim 25, further comprising:
- a buffer, operatively connected to said signal generator, to buffer the analog excitation signal;
- said second analog-to-digital converter being operatively connected to said buffer to convert said buffered analog excitation signal to said second digital signal.

34. The integrated circuit as claimed in claim 25, further comprising:
- a filter, operatively connected to said signal generator, to filter the analog excitation signal;
- said second analog-to-digital converter being operatively connected to said filter to convert said filtered analog excitation signal to said second digital signal.

35. The integrated circuit as claimed in claim 25, further comprising:
- a buffer/filter circuit, operatively connected to said signal generator, to buffer and filter the analog excitation signal;
- said second analog-to-digital converter being operatively connected to said buffer/filter circuit to convert said buffered and filtered analog excitation signal to said second digital signal.

36. The integrated circuit as claimed in claim 25, further comprising:
- a buffer, operatively connected to said first analog-to-digital converter, to buffer said first analog signal;
- said first analog-to-digital converter being operatively connected to said buffer to convert said buffered first analog signal to said first digital signal.

37. The integrated circuit as claimed in claim 25, further comprising:
- a filter, operatively connected to said first analog-to-digital converter, to filter said first analog signal;
- said first analog-to-digital converter being operatively connected to said filter to convert said filtered first analog signal to said first digital signal.

38. The integrated circuit as claimed in claim 25, further comprising:
- a buffer/filter circuit, operatively connected to said first analog-to-digital converter, to buffer and filter said first analog signal;
- said first analog-to-digital converter being operatively connected to said buffer/filter circuit to convert said buffered and filtered first analog signal to said first digital signal.

39. The integrated circuit as claimed in claim 25, wherein said signal generator generates a clock signal as said analog excitation signal.

40. The integrated circuit as claimed in claim 25, wherein said signal generator generates a sinusoidal oscillation as said analog excitation signal.

41. The integrated circuit as claimed in claim 25, wherein said signal generator generates an arbitrary waveform as said analog excitation signal.

42. An integrated circuit, comprising:
- an analog-to-digital converter to convert an analog signal to a first digital signal;
- a digital signal source to provide a second digital signal representing an excitation signal;
- a digital-to-analog converter, operatively connected to said digital signal source, to convert said second digital signal to an analog excitation signal; and
- a multiplier, operatively connected to said analog-to-digital converter and said digital signal source, to multiply said first and second digital signals.

43. The integrated circuit as claimed in claim 42, further comprising:
- a multiplexer to multiplex between multiple channels having analog signals thereon such that an analog signal from one channel of the multiple channels is fed to said analog-to-digital converter as said analog signal.

44. The integrated circuit as claimed in claim 42, further comprising:
- a programmable gain amplifier to amplify said analog signal and to feed the amplified first analog signal to said analog-to-digital converter.

45. The integrated circuit as claimed in claim 42, further comprising:
- a phase adjustment circuit, operatively connected between said digital signal source and said multiplier, to adjust the phase of said second digital signal.

46. The integrated circuit as claimed in claim 42, further comprising:
- a phase adjustment circuit, operatively connected between said analog-to-digital converter and said multiplier, to adjust the phase of said first digital signal.

47. The integrated circuit as claimed in claim 42, further comprising:
- a first phase adjustment circuit, operatively connected between said digital signal source and said multiplier, to adjust the phase of said second digital signal; and
- a second phase adjustment circuit, operatively connected between said analog-to-digital converter and said multiplier, to adjust the phase of said first digital signal.

48. The integrated circuit as claimed in claim 42, further comprising:
- a phase adjustment circuit, operatively connected between said digital signal source and said multiplier, to adjust the phase of said second digital signal and to produce a first phase adjusted signal and a second phase adjusted signal;

a second multiplier, operatively connected to said first analog-to-digital converter and said phase adjustment circuit, to multiply said first digital signal with said first phase adjusted signal;

said multiplier being operatively connected to said first analog-to-digital converter and said phase adjustment circuit, to multiply said first digital signal with said second phase adjusted signal.

49. The integrated circuit as claimed in claim 42, further comprising:

a lowpass filter circuit, operatively connected to said multiplier, to filter the signal received from said multiplier.

50. The integrated circuit as claimed in claim 42, further comprising:

a buffer, operatively connected to said analog-to-digital converter, to buffer said analog signal;

said analog-to-digital converter being operatively connected to said buffer to convert said buffered analog signal to said first digital signal.

51. The integrated circuit as claimed in claim 42, further comprising:

a filter, operatively connected to said analog-to-digital converter, to filter said analog signal;

said analog-to-digital converter being operatively connected to said filter to convert said filtered analog signal to said first digital signal.

52. The integrated circuit as claimed in claim 42, further comprising:

a buffer/filter circuit, operatively connected to said analog-to-digital converter, to buffer and filter said analog signal;

said analog-to-digital converter being operatively connected to said buffer/filter circuit to convert said buffered and filtered analog signal to said first digital signal.

53. The integrated circuit as claimed in claim 42, wherein said digital signal source is a direct digital synthesizer.

54. The integrated circuit as claimed in claim 42, wherein said digital signal source is a memory storing a digital representation of the excitation signal.

55. The integrated circuit as claimed in claim 42, wherein said signal generator generates a clock signal as said analog excitation signal.

56. The integrated circuit as claimed in claim 42, wherein said signal generator generates a sinusoidal oscillation as said analog excitation signal.

57. The integrated circuit as claimed in claim 42, wherein said signal generator generates an arbitrary waveform as said analog excitation signal.

58. A method for excitation and synchronous demodulation, comprising:

(a) converting a first analog signal to a first digital signal;

(b) generating an analog excitation signal;

(c) converting the analog excitation signal to a second digital signal; and (d) multiplying the first and second digital signals.

59. The method as claimed in claim 58, further comprising:

(e) multiplexing between multiple channels having analog signals thereon such that an analog signal from one channel of the multiple channels is converted as the first analog signal.

60. The method as claimed in claim 58, further comprising:

(e) amplifying the first analog signal prior to converting the first analog signal to the first digital signal.

61. The method as claimed in claim 58, further comprising:

(e) adjusting the phase of the second digital signal prior to multiplication.

62. The method as claimed in claim 58, further comprising:

(e) adjusting the phase of the first digital signal prior to multiplication.

63. The method as claimed in claim 58, further comprising:

(e) adjusting the phase of the second digital signal prior to multiplication; and (f) adjusting the phase of the first digital signal prior to multiplication.

64. The method as claimed in claim 58, further comprising:

(e) filtering the multiplied signal.

65. A method for excitation and synchronous demodulation, comprising:

(a) converting an analog signal to a first digital signal;

(b) providing a second digital signal representing an excitation signal;

(c) converting the second digital signal to an analog excitation signal; and (d) multiplying the first and second digital signals.

66. The method as claimed in claim 65, further comprising:

(e) multiplexing between multiple channels having analog signals thereon such that an analog signal from one channel of the multiple channels is converted as the first digital signal.

67. The method as claimed in claim 65, further comprising:

(e) amplifying the analog signal prior to digital conversion.

68. The method as claimed in claim 65, further comprising:

(e) adjusting the phase of the second digital signal prior to multiplication.

69. The method as claimed in claim 65, further comprising:

(e) adjusting the phase of the first digital signal prior to multiplication.

70. The method as claimed in claim 65, further comprising:

(e) adjusting the phase of the second digital signal prior to multiplication; and (f) adjusting the phase of the first digital signal prior to multiplication.

71. The method as claimed in claim 65, further comprising:

(e) filtering the multiplied signal.

72. The method as claimed in claim 65, wherein the second digital signal is synthesized.

73. The method as claimed in claim 65, wherein the second digital signal is pre-stored in a memory.

* * * * *